(12) United States Patent
Hanke

(10) Patent No.: US 6,584,130 B2
(45) Date of Patent: Jun. 24, 2003

(54) MULTIPLE SEMICONDUCTOR LASER STRUCTURE WITH NARROW WAVELENGTH DISTRIBUTION

(75) Inventor: Christian Hanke, München (DE)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 10/061,006

(22) Filed: Jan. 30, 2002

(65) Prior Publication Data

US 2002/0126722 A1 Sep. 12, 2002

Related U.S. Application Data

(63) Continuation of application No. PCT/DE00/02449, filed on Jul. 26, 2000.

(30) Foreign Application Priority Data

Jul. 30, 1999 (DE) .......................... 199 35 998

(51) Int. Cl.$^7$ ............................................. H01S 5/00
(52) U.S. Cl. ........................ 372/50; 372/50; 372/23; 372/45
(58) Field of Search .............................. 372/50, 23, 45

(56) References Cited

U.S. PATENT DOCUMENTS 5,212,706 A * 5/1993 Jain ........................... 372/50

FOREIGN PATENT DOCUMENTS

FR 2 761 537 10/1998

OTHER PUBLICATIONS

S.G. Patterson et al.: "Continuous–wave room temperature operation of bipolar cascade laser", Electronic Letters, vol. 35, No. 5, Mar. 4, 1999, pp. 395–397.

Hao–Lin Chen et al.: "Collimating Diode Laser Beams from a Large–Area VCSEL–Array Using Microlens Array", IEEE Photonics Technology Letters, vol. 11, No. 5, May 1999, pp. 506–508.

J.Ch. Garcia et al.: "Epitaxially stacked laser with Esaki junctions: A bipolar cascade laser", Appl. Phys. Lett., vol. 71, No. 26, Dec. 29, 1997, pp. 3752–3754.

W. Schmid et al.: "CW operation of a diode cascade InGaAs quantum well VCSEL", Electronics letters, vol. 34, No. 6, Mar. 19, 1998, pp. 553–555.

J.P. van der Ziel et al.: "Integrated multilayer GaAs lasers separated by tunnel junctions", Appl. Phys. Lett., vol. 41, No. 6, Sep. 15, 1982, pp. 499–501.

Mark D. Skeldon: "A design approach for a thermally compensated injection laser stack transmitter/receiver", Optical Engineering, vol. 21, No. 6, Nov./Dec. 1982, pp. 1046–1050.

\* cited by examiner

*Primary Examiner*—James Davie
(74) *Attorney, Agent, or Firm*—Laurence A. Greenberg; Werner H. Stemer; Ralph E. Locher

(57) ABSTRACT

In the case of a multiple semiconductor laser structure containing a plurality of laser pn junctions stacked vertically one on top of the other, different operating temperatures of the active zones occur during operation on account of the different distance within the layer structure from a common heat sink. The displacements in the emission wavelength caused by the temperature influence are compensated by a variation of the thickness and/or material composition of the active zones, so that a narrow wavelength distribution is achieved.

7 Claims, 2 Drawing Sheets

US 6,584,130 B2

MULTIPLE SEMICONDUCTOR LASER STRUCTURE WITH NARROW WAVELENGTH DISTRIBUTION

CROSS-REFERENCE TO RELATED APPLICATION

This application is a continuation of copending International Application No. PCT/DE00/02449, filed Jul. 26, 2000, which designated the United States.

BACKGROUND OF THE INVENTION

FIELD OF THE INVENTION

The present invention relates to a multiple semiconductor laser structure. The structure contains a plurality of laser pn junctions stacked vertically one on top of another and each has an active, light-emitting zone. The laser pn junctions each have an n region and a p region, $n^+p^+$ tunnel junctions are disposed between and separate vertically neighboring ones of the laser pn junctions. The $n^+p^+$ tunnel junctions have an $n^+$-doped layer and a $p^+$-doped layer, the $n^+$-doped layer adjoins the n region of the laser pn junctions and the $p^+$-doped layer adjoins the p region of another one of the laser pn junctions. A $n^+$-doping concentration and a $p^+$-doping concentration are chosen such that a relatively low electrical resistance of the $n^+p^+$ tunnel junctions is obtained during operation. A first contact metallization is disposed on the p region of one of the laser pn junctions, and a second contact metallization is disposed on the n region of another one of laser pn junctions.

In the course of the development of semiconductor lasers of high output power, semiconductor laser structures in which a plurality of semiconductor lasers are coupled to one another in a planar manner and connected in series between the poles of a voltage source have also been produced. The first components of this type were produced by a plurality of semiconductor lasers being soldered to one another in a planar manner. However, it has long been known (see the article by Van Der Ziel, et al., "Appl. Phys. Lett." 41, p. 500, 1982) to connect a plurality of GaAs double-heterostructure lasers to one another by interconnecting in each case two vertically neighboring laser pn junctions by a highly doped $n^+p^+$ tunnel junction. The $n^+p^+$ tunnel junction contains two thin n- and p-doped semiconductor layers, the $n^+$-doped layer directly adjoining the n region of the one pn junction and the $p^+$-doped layer directly adjoining the p region of the other pn junction. The semiconductor material of the tunnel junction can generally be different from or identical to the semiconductor material of the adjoining pn junctions. If a voltage is applied in a forward direction to the series-connected pn junctions via externally applied contact metallizations, the $n^+p^+$ junctions are reverse-biased. On account of the high doping, however, a tunnel junction that has no blocking effect is formed. Rather, in the $n^+p^+$ tunnel junction a hole current in the p region is converted into an electron current in the n region. As a result, a highly conductive, virtually metallic contact junction is established between the vertically neighboring pn junctions. It is required for this purpose that the doping concentrations in the layers of the $n^+p^+$ tunnel junction lie in the range of $10^{19}$ cm$^{-3}$ or above.

The optical fields of the laser structures lying one on top of the other may optionally be coupled with one another or decoupled from one another. This is achieved by the dimensioning of the layer composition and thicknesses.

In the publication by Garcia, et al. in "Appl. Phys. Lett." 71, p. 3752, 1997, there is a description of an InGaAs/AlGaAs laser structure emitting at different wavelengths, in which pn junctions are stacked one on top of the other by epitaxial growth and are separated from one another by a low-impedance $n^+p^+$ tunnel junction, in which the n doping is formed by carbon and the p doping is formed by sulfur.

On account of the finite thermal conductivity of the individual layers, however, the following problem arises. In each of the laser pn junctions, heating takes place during operation due to the power loss of the electric current and due to non-radiating recombination processes in the active zones. Since, however, the semiconductor lasers are stacked vertically one on top of the other and are mounted with a common substrate on a heat sink, the heat produced in such a way flows away to the heat sink at different rates from the individual semiconductor lasers. While the semiconductor laser lying closest to the heat sink can dissipate its excess heat relatively quickly to the heat sink, the semiconductor laser at the greatest distance from the heat sink exhibits the greatest steady-state heating during operation, since its excess amount of heat must flow through the entire layer structure to reach the heat sink. If the active zones of the individual lasers of the multiple semiconductor laser structure are configured in the same manner, these lasers will, however, emit light radiation at different wavelengths because of the temperature dependence of the band gap of the semiconductor material used. This is disadvantageous for a number of applications. In particular, the pumping of solid-state lasers requires a narrow-band emission of the semiconductor laser in order to use the absorption bands of the solid-state laser effectively.

SUMMARY OF THE INVENTION

It is accordingly an object of the invention to provide a multiple semiconductor laser structure with narrow wavelength distribution that overcomes the above-mentioned disadvantages of the prior art devices of this general type, which is capable of emitting light radiation with a narrow wavelength distribution.

With the foregoing and other objects in view there is provided, in accordance with the invention, a multiple semiconductor laser structure. The structure contains a plurality of laser pn junctions stacked vertically one on top of another and each has an active, light-emitting zone. The be laser pn junctions each have an n region and a p region. The active, light-emitting zones of the laser pn junctions each have a material composition and a given thickness. At least one of the material composition and the given thickness is set to match one another in such a way that an influence of different operating temperatures on an emission wavelength is compensated for during operation. A $n^+p^+$ tunnel junction is disposed between and separates each pair of vertically neighboring ones of the laser pn junctions. The $n^+p^+$ tunnel junction has an $n^+$-doped layer and a $p^+$-doped layer, the $n^+$-doped layer adjoins the n region of one of the laser pn junctions and the $p^+$-doped layer adjoins the p region of another one of the laser pn junctions. A $n^+$-doping concentration and a $p^+$-doping concentration of the $n^+$-doped layer and the $p^+$-doped, respectively, is chosen such that a relatively low electrical resistance of the $n^+p^+$ tunnel junction is obtained during operation. A first contact metallization is disposed on the p region of one of the laser pn junctions, and a second contact metallization is disposed on the n region of another of the laser pn junctions.

In a first embodiment of the present invention, the active zones are respectively formed by the well layers of single or multiple quantum well structures and the thicknesses of the well layers of different pn junctions are chosen differently such that the influence of the different operating temperatures of the pn junctions on their emission wavelengths is compensated during operation. In a practical exemplary embodiment of this, in the case of a semiconductor laser for which a relatively high operating temperature is assumed during operation, a relatively small thickness of the quantum well layer is chosen in order to counteract the temperature-induced band edge lowering.

Instead of quantum well structures, quantum wire structures or quantum dot structures may also be used, the thickness of the quantum wire or of the quantum dot then being chosen in a correspondingly compensatory way.

In a second embodiment of the present invention, the active zones are respectively formed by bulk material layers, the material compositions of different pn junctions of which are chosen such that the influence of the different operating temperatures of the pn junctions on their emission wavelengths is compensated for during operation. A temperature-induced band edge lowering can be counteracted here, for example, by an increased Al content in the AlGaAs bulk material of the pn junction.

A third embodiment contains a combination of the aforementioned first and second embodiments. In this case, both the thicknesses and the material compositions of the active zones are varied in order to compensate for the temperature influence on the band edge lowering.

In accordance with an added feature of the invention, the multiple semiconductor laser structure is to be mounted on a heat sink, and a thickness of the well layers decreases with an increasing distance of a respective one of the pn junctions from the heat sink.

In accordance with a further feature of the invention, the multiple semiconductor laser structure is to be mounted on a heat sink, and a material composition of the bulk material layers is chosen such that an increase in a band gap of the material composition of the bulk material layers is obtained with an increasing distance from the heat sink.

In accordance with another feature of the invention, the $n^+p^+$ tunnel junction is one of a plurality of $n^+p^+$ tunnel junctions disposed between and separating each pair of the vertically neighboring ones of the laser pn junctions.

Other features which are considered as characteristic for the invention are set forth in the appended claims.

Although the invention is illustrated and described herein as embodied in a multiple semiconductor laser structure with narrow wavelength distribution, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
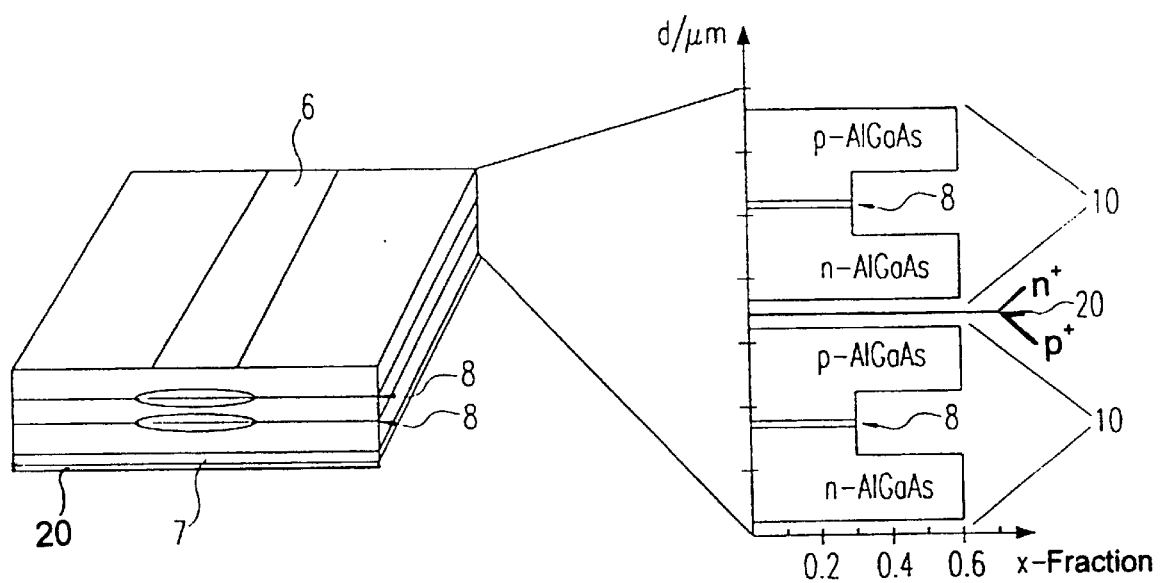
FIG. 1 is a diagrammatic, perspective view of a multiple semiconductor laser structure and a pulled-apart graphic representation of a layer structure in dependence on an Al-component of the layer structure.

In all the figures of the drawing, sub-features and integral parts that correspond to one another bear the same reference symbol in each case. Referring now to the figures of the drawing in detail and first, particularly, to FIG. 1 thereof, there is shown multiple semiconductor laser structure formed on the basis of GaAs material technology.

However, the present invention is not restricted to the GaAs material technology and can be applied in principle to any other semiconductor material technology.

In the multiple semiconductor laser structure perspectively represented in the left half of FIG. 1, two pn junctions 10 are stacked vertically one on top of the other and separated from each other by an $n^+p^+$-tunnel junction 20. The tunnel junction 20 contains two highly doped $n^+$-GaAs and $p^+$-GaAs layers, of which the $n^+$-layer adjoins an n-region of the one neighboring pn-junction 10 and the $p^+$-layer adjoins the p-region of the other neighboring pn junction 10. Each of the pn junctions 10 has an active, light-emitting zone 8. The structure usually contains a first, upper contact metallization 6, which is formed by one or more strips and is connected to the p side of the semiconductor laser structure. An opposite contact metallization 7 is connected to the n side of the semiconductor laser structure and is usually applied to the n substrate over its full surface area.

Represented in the right half of FIG. 1 is a diagram in which a thickness d of the multiple semiconductor laser structure is represented in $\mu$m in dependence on an x component of the individual $Ga_{1-x}Al_xAs$ layers. The individual laser structures are consequently single quantum well structures in which the active zone 8 is formed by a thin layer of GaAs. The layer is respectively enclosed by two AlGaAs layers with an Al content of 0.3. The layers are adjoined by AlGaAs layers with an Al content of 0.6. Between the two outer layers, the emitted light radiation is guided on the boundary surface of the AlGaAs layers on both sides on the basis of the step-shaped variation in the refractive index, while the charge carriers injected from the outside are trapped in the GaAs layer ("separate confinement"). The tunnel junction 20 connecting the two pn junctions is formed by two highly doped $n^+$- and $p^+$-doped GaAs layers. The layer thickness preferably lies in the range of 20–200 nm.

During operation, the multiple semiconductor laser structure represented is in connection with a heat sink 20 on one side. This results in a steady-state temperature distribution in which the temperature increases continuously with increasing distance from the heat sink 20. The semiconductor laser furthest away from the heat sink 20 consequently has the highest steady-state operating temperature during operation. In the case of semiconductor materials, however, it is known that a band gap decreases with increasing temperature. Therefore, the distance between the quantized energy levels in the thin GaAs quantum well layers 8 would also decrease and, as a consequence, the emission wavelength would increase. One of the intentions of the invention is to compensate for this effect.

Figure 2:
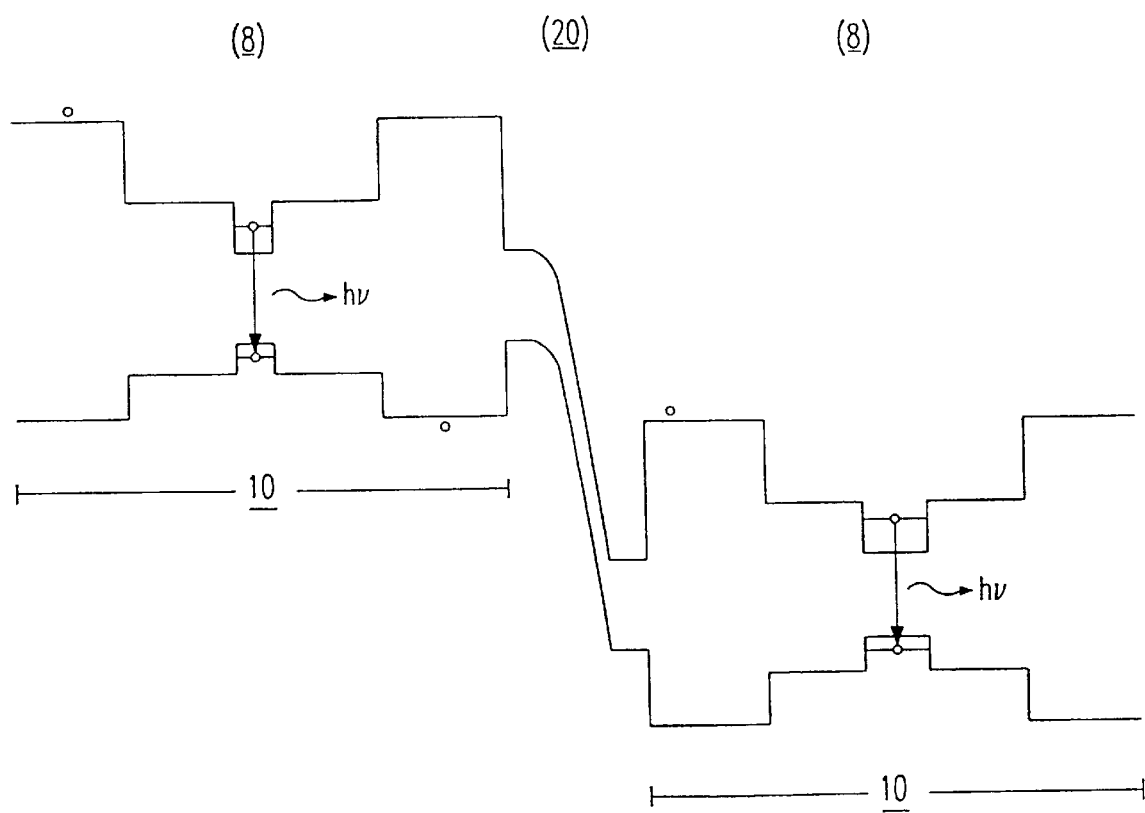
FIG. 2 is an illustration of an energy band structure of the multiple semiconductor laser structure shown in FIG. 1.

An energy band structure of the multiple semiconductor laser structure of FIG. 1 is represented in FIG. 2. Within each pn junction 10, the step-shaped variation of the conduction band and valence band can be seen. Within the nominally undoped, very thin GaAs quantum well structure 8, at least one quantized energy level is formed in the conduction band and valence band, so that, when current is injected via the p stripline contact, electrons flow into the GaAs quantum well layer 8 and, after the population inversion commences, a laser transition can take place between the quantized energy levels. The compensation for the temperature-induced displacement of the band gap is brought about by different thicknesses being chosen for the two GaAs quantum well layers 8. The semiconductor laser represented in the right half of the image of FIG. 2 is located in the direct vicinity of the heat sink 20, so that the heat produced in it can be dissipated relatively quickly. In contrast, the semiconductor laser represented in the left half of the image is positioned at a greater distance from the heat sink 20, so that it has a higher operating temperature during operation. The reduction in the band gap brought about as a result, and consequently the energy difference between the quantized energy levels, is compensated by choosing a somewhat smaller thickness for the corresponding GaAs quantum well layer 8. The reduction in the thickness brings about a rise in the energy levels in the potential wells of the conduction band and valence band of the GaAs quantum well layer 8. This compensates for the lowering of the energy levels brought about by the temperature influence, so that the active zones of the two semiconductor lasers emit light radiation with the same wavelength.

In a modification of this embodiment, each semiconductor laser may contain a multiple quantum well structure. If desired and required, a variable thickness of the quantum well layers may also be set within such a multiple quantum well structure.

The extent of the required variation in the thicknesses of the different semiconductor lasers can be determined before manufacture of the multiple semiconductor laser structure in a relatively simple heat diffusion model. The model should provide the steady-state operating temperatures of the semiconductor lasers from which the temperature-dependent reduction in the band gap can be determined with the assistance of the relevant literature. Then, a relatively simple potential well model should provide the reduction in the layer thickness required for the compensation.

This procedure is clearly illustrated by the following example. The example is based on a GaAs semiconductor body with the structure represented in FIG. 1 and a cross-sectional surface area of 100 μm×600 μm.

The thickness of the $Ga_{1-x}Al_xAs$ layers with an Al content of x=0.6 is 1200 nm, the thickness of the $Ga_{1-x}Al_xAs$ layers with an Al content of x=0.3 is 1000 nm and the thickness of the tunnel layer is 400 nm. The central wavelength of the emitted laser radiation lies around 800 nm. The active zones 8 are configured as a quantum well with a thickness of 7 nm.

Let us assume that the temperatures and the emission wavelengths of the active zones 8 do not deviate too much from one another, so that a linearized calculation is possible as an approximation. In this case, it is sufficient to determine the temperature difference between the active zones 8.

If the layer sequence between the active zones 8 is considered as a series of thermal resistances with the parameters specified in the following table, an overall resistance of 6.1 K/W is obtained between the active zones 8 as the sum of the individual thermal resistances. The active zones 8 themselves can in this case be ignored on account of their small thickness.

| Type of layer | Thickness | Specific thermal resistance | Thermal resistance |
|---|---|---|---|
| active zone | 7 nm | — | — |
| n-$Ga_{1-x}Al_xAs$, x = 0.3 | 1200 nm | 8.0 cmK/W | 1.6 K/W |
| n-$Ga_{1-x}Al_xAs$, x = 0.6 | 1000 nm | 8.5 cmK/W | 1.4 K/W |
| GaAs tunnel layer | 400 nm | 2.0 cmK/W | 0.1 K/W |
| p-$Ga_{1-x}Al_xAs$, x = 0.3 | 1000 nm | 8.5 cmK/W | 1.4 K/W |
| p-$Ga_{1-x}Al_xAs$, x = 0.6 | 1200 nm | 8.0 cmK/W | 1.6 K/W |
| active zone | 7 nm | | |

A typical electrical power loss of 2.0 W in the active zones 8 results in a temperature difference of 12.2 K between the active zones 8. Given a temperature coefficient of the emission wavelength of 0.26 nm/K, this leads to a difference in wavelength of 3.2 nm between the active zones 8. For the structure of the semiconductor body taken as a basis, the differential change in wavelength in dependence on the quantum well thickness $\Delta\lambda/\Delta d$ is approximately 11.5 nm/nm.

Consequently, the difference in wavelength of 3.2 nm can be compensated by the thickness of the quantum well layer with the higher operating temperature being reduced by 0.28 nm.

In the example, typical material constants, taken from the relevant literature, of the GaAs semiconductor system were used.

It goes without saying that, depending on the application, other data, in particular experimentally obtained data, can also be used. Similarly, if appropriate, the temperature distribution in the semiconductor body can be determined by further methods, for example by finite-element methods or by resolving the heat conduction equation.

In the second embodiment of the present invention, the active zone 8 is formed by a pn junction formed from a bulk material. In this case, a reduction in the band gap brought about by the temperature influence is compensated by the Al component x being varied in the $Ga_{1-x}Al_xAs$ material of the nominally undoped region of the active zone 8. For the semiconductor laser further away from the heat sink, a greater value of x is accordingly chosen, whereby the band gap is increased and consequently its reduction due to the temperature increase is counteracted.

For the calculation example presented above, the difference in the emission wavelengths of 3.2 nm is compensated by an increase in the Al component x by 0.008.

The third embodiment of the present invention is realized for example in the exemplary embodiment shown in the FIGS. 1 and 2 by the material composition of the GaAs quantum well layer being varied in addition to the variation in the thickness. The depth of the potential wells is set by the material composition. Consequently, the temperature influence on the band gap can be compensated by both the thickness of the well layers and the thickness of their potential wells with suitable choice of these values.

The invention consequently provides a semiconductor laser with a high light output power and narrow wavelength distribution. A semiconductor laser of this type is outstandingly suitable in particular for the pumping of other solid-state lasers, such as Nd:YAG lasers.

I claim:

1. A multiple semiconductor laser structure, comprising:
   a plurality of laser pn junctions stacked vertically one on top of another and each having an active, light-emitting zone, said laser pn junctions each having an n region and a p region, said active, light-emitting zone of said laser pn junctions each having a material composition and a given thickness, at least one of said material composition and said given thickness matching one another to compensate for an influence of different operating temperatures on an emission wavelength during operation;

a $n^+p^+$ tunnel junction disposed between and separating each pair of vertically neighboring ones of said laser pn junctions, said $n^+p^+$ tunnel junction having an $n^+$-doped layer and a $p^+$-doped layer, said $n^+$-doped layer adjoining said n region of one of said laser pn junctions and said $p^+$-doped layer adjoining said p region of another one of said laser pn junctions, a $n^+$-doping concentration and a $p^+$-doping concentration of said $n^+$-doped layer and said $p^+$-doped, respectively, chosen such that a relatively low electrical resistance of said $n^+p^+$ tunnel junction being obtained during operation;

a first contact metallization disposed on said p region of one of said laser pn junctions; and a second contact metallization disposed on said n region of another of said laser pn junctions.

2. The multiple semiconductor laser structure according to claim 1, wherein:

said active, light-emitting zone has a structure selected from the group consisting of well layers of a single quantum well structure, well layers of multiple quantum well structures, a single quantum wire structure, multiple quantum wire structures, and quantum dot structures; and a thickness of said structure of different ones of said pn junctions are chosen differently such that the influence of the different operating temperatures of said pn junctions on the emission wavelengths is compensated for during operation.

3. The multiple semiconductor laser structure according to claim 2, wherein the multiple semiconductor laser structure is to be mounted on a heat sink, and a thickness of said well layers decreases with an increasing distance of a respective one of said pn junctions from the heat sink.

4. The multiple semiconductor laser structure according to claim 2, wherein a thickness of said well layers is varied and a material composition of said well layers is varied.

5. The multiple semiconductor laser structure according to claim 1, wherein said active, light-emitting zone is formed by bulk material layers, and said material composition of different ones of said laser pn junctions are chosen such that the influence of the different operating temperatures of said laser pn junctions on the emission wavelengths is compensated for during operation.

6. The multiple semiconductor laser structure according to claim 5, wherein the multiple semiconductor laser structure is to be mounted on a heat sink, and a material composition of said bulk material layers is chosen such that an increase in a band gap of said material composition of said bulk material layers is obtained with an increasing distance from the heat sink.

7. The multiple semiconductor laser structure according to claim 1, wherein said $n^+p^+$ tunnel junction is one of a plurality of $n^+p^+$ tunnel junctions disposed between and separating each pair of said vertically neighboring ones of said laser pn junctions.

* * * * *